United States Patent [19]

Logan et al.

[11] 4,194,933

[45] Mar. 25, 1980

[54] METHOD FOR FABRICATING JUNCTION LASERS HAVING LATERAL CURRENT CONFINEMENT

[75] Inventors: Ralph A. Logan, Morristown; Won-Tien Tsang, Summit, both of N.J.

[73] Assignee: Bell Telephone Laboratories, Incorporated, Murray Hill, N.J.

[21] Appl. No.: 39,862

[22] Filed: May 17, 1979

Related U.S. Application Data

[62] Division of Ser. No. 794,466, May 6, 1977, Pat. No. 4,169,997.

[51] Int. Cl.² .......................................... H01L 21/208
[52] U.S. Cl. .................................... 148/171; 148/172; 29/569 L; 29/576 E; 331/94.5 H; 357/16
[58] Field of Search .............. 148/171, 172; 29/569 L, 29/576 E; 357/16; 331/94.5 H

[56] References Cited

U.S. PATENT DOCUMENTS

| | | | |
|---|---|---|---|
| 3,780,358 | 12/1973 | Thompson | 331/94.5 H |
| 3,859,178 | 1/1975 | Logan et al. | 204/15 |
| 3,865,646 | 2/1975 | Logan et al. | 148/171 |
| 3,961,996 | 6/1976 | Namizaki et al. | 148/171 |
| 3,978,428 | 8/1976 | Burnham et al. | 331/94.5 H |
| 3,983,510 | 9/1976 | Hayashi et al. | 331/94.5 H |
| 3,984,262 | 10/1976 | Burnham et al. | 148/172 |
| 4,023,993 | 5/1977 | Scifres et al. | 148/172 |
| 4,121,177 | 10/1978 | Tsukada et al. | 331/94.5 H |

FOREIGN PATENT DOCUMENTS 2627355  12/1976  Fed. Rep. of Germany ..... 331/94.5 H

OTHER PUBLICATIONS

Burhman et al., *Applied Physics Letters*, vol. 29, No. 5, Sept. 1976, pp. 287–289.
Burham et a., *IEEE J. of Quantum Electronics*, No. 1, QE-11, No. 7, Jul. 1975, pp. 418–420.
Itoh et al., *IEEE J. of Quantum Electronics*, vol. QE-11, No. 7, Jul. 1975, pp. 421–426.
Tsukada, *J. of Applied Physics*, vol. 45, No. 11, Nov. 1974, pp. 4899–4906.

*Primary Examiner*—G. Ozaki
*Attorney, Agent, or Firm*—Michael J. Urbano

[57] ABSTRACT

Described is a method for fabricating a stripe geometry double heterostructure (DH) junction laser in which lateral current confinement is acheived by pairs of laterally spaced, reverse-biased p-n junctions. A mesa is formed on an n-GaAs substrate, for example, and a layer of p-AlGaAs is then grown by LPE so that nucleation does not occur on the top of the mesa. Laterally spaced zones of p-AlGaAs are thus formed on either side of the mesa. An n-p-p or n-n-p DH is then grown so that the interface between the p-AlGaAs layers and the first n-layer of the DH forms a pair of laterally spaced p-n junctions separated by the mesa. When the light-emitting p-n junction in the DH active region is forward biased, the pair of spaced junctions are reverse biased so that pumping current is constrained to flow through the active region in a narrow channel to the mesa. Further lateral current confinement is achieved by forming on the upper DH surface a second air of reverse biased p-n junctions separated by a window in alignment with the mesa.

9 Claims, 1 Drawing Figure

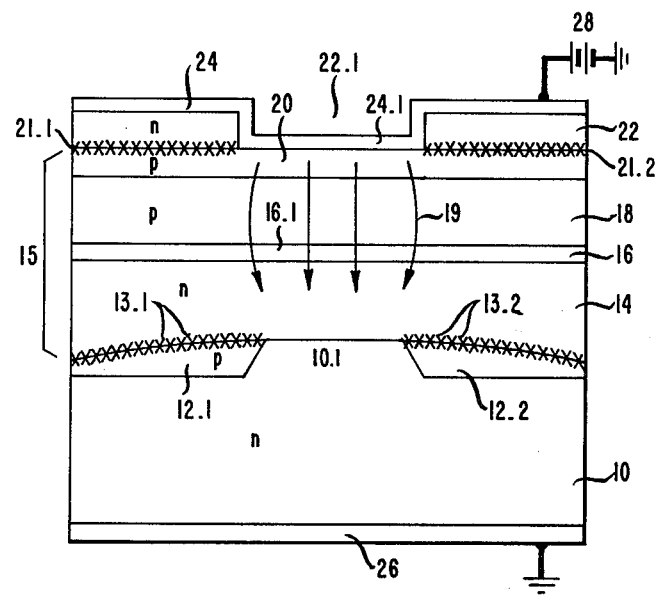

METHOD FOR FABRICATING JUNCTION LASERS HAVING LATERAL CURRENT CONFINEMENT

This is a division of application Ser. No. 794,466 filed on May 6, 1977 now U.S. Pat. No. 4,169,997.

BACKGROUND OF THE INVENTION

This invention relates to semiconductor junction lasers and, more particularly, to lateral current confinement (LCC) in stripe geometry junction lasers.

The stripe geometry junction laser was first proposed by R. A. Furnanage and D. K. Wilson (U.S. Pat. No. 3,363,195 issued on Jan. 9, 1968) as a means to reduce the number of lasing modes. The stripe geometry also reduces the threshold current for lasing, which alleviates heat sinking and other problems, and limits the spatial width of the output beam, which facilitates coupling into an optical fiber. Since that early proposal, numerous laser configurations have been devised to implement the stripe geometry concept, but clearly the front runner, both in terms of widespread usage as well as reliability, is the proton bombarded double heterostructure (DH) laser described by J. C. Dyment et al, *Applied Physics Letters*, Vol. 10, page 84 (1967), and L. A. D'Asaro et al, U.S. Pat. No 3,824,133 issued on July 16, 1974.

Notwithstanding the success of DH stripe geometry junction lasers delineated by proton bombardment, workers in the art have suggested a virtual plethora of alternative structures aimed primarily at one or more objects such as lowering the lasing threshold, controlling filamentary light outputs and producing more symmetric light beams. One such configuration is the LCC junction laser in which the stripe or channel through which current flows under forward bias to the active region is delineated by laterally separated reverse-biased p-n junctions. The space between the junctions defines the stripe.

One type of LCC stripe geometry junction laser is the heteroisolation laser described by K. Itoh et al in *IEEE J. Quant. Electr.*, Vol. QE-11, No. 7, pp. 421–426 (1975). This laser is a conventional n-n-p AlGaAs DH except that a layer of n-AlGaAs is grown on the p-GaAs cap layer to form a blocking junction at the interface therebetween. A stripe is etched through the n-AlGaAs layer so as to expose the underlying p-GaAs cap, thereby bifurcating both the n-AlGaAs layer and the blocking junction. A metal contact is then deposited over both the bifurcated n-AlGaAs layer and the exposed p-GaAs stripe. When the active region p-n junction is forward biased, the bifurcated p-n junction is reverse biased. Thus, current through the n-AlGaAs segments is blocked and constrained to flow through the p-GaAs stripe to the active region. Thresholds in the Itoh et al lasers were, however, relatively high; for example, 460 mA for the fundamental mode at 7620 angstroms (FIG. 5) and 3000 A/cm$^2$ for an active region thickness of 0.2–0.3 $\mu$m (FIG. 4).

Another variant of the LCC stripe geometry junction laser, of the type which utilizes reverse biased p-n junctions to delineate the stripe, is taught by R. D. Burnham et al in *IEEE J. Quant. Electr.* Vol. QE-11, No. 7, pp. 418–420 (1975). A stripe mask is deposited on an n-GaAs substrate and then Zn is diffused into the exposed portions. Laterally separate blocking p-n junctions are thus formed in the substrate. Then, a conventional n-p-p AlGaAs-GaAs-AlGaAs DH is grown on the diffused substrate surface. When the active region p-n junction is forward biased, the blocking junctions in the substrate are reverse biased thereby constraining current to flow through the stripe therebetween. As with the Itoh et al LCC lasers, however, thresholds were high. Pulsed thresholds were greater than about 150 mA (8000 A/cm$^2$) for a stripe width of 10 $\mu$m and an active region thickness of 0.45 $\mu$m.

A further modification of their LCC laser is suggested by R. D. Burnham et al in U.S. Pat. No. 3,984,262 issued on Oct. 5, 1976 which describes the use of laterally separated reverse biased p-n junctions not only in the substrate but also in the top surface of the DH (col. 5, lines 1–19). Operating parameters, such as lasing threshold, are not given for the modified LCC laser.

What is apparent, however, is that the lasing threshold of this class of LCC stripe geometry DH lasers has fallen far short of an improvement over conventional DH lasers which routinely have thresholds of about 100 mA.

SUMMARY OF THE INVENTION

We have developed a new reverse biased p-n junction LCC stripe geometry DH laser, and technique for fabricating same, in which the lasing threshold is reduced considerably below that of comparable prior art stripe geometry DH lasers or LCC-DH lasers. In fact, we have attained pulsed and continuous wave (CW) thresholds as low as 45 mA and 65 mA respectively for a stripe area of 14 $\mu$m $\times$ 150 $\mu$m.

In one embodiment our technique includes the steps of: (1) forming a stripe mesa on a major surface of a monocrystalline substrate of one conductivity type, the width of the mesa corresponding to the desired laser stripe width; (2) epitaxially growing by LPE a first pair of layers of the opposite conductivity type on the major surface and contiguous with the side walls of the mesa. It is a feature of our process that growth nucleation on the top of the mesa is inhibited so that the first pair of layers are actually grown simultaneously in two separate zones, one on either side of the mesa; and (3) epitaxially growing a laser structure on the first pair of layers and the mesa so as to form at the interface with the first layers a first pair of laterally spaced blocking p-n junctions separated by the mesa. The laser structure includes an active region and a light emitting p-n junction therein which, when forward biased and pumped with current above threshold, causes the active region to emit stimulated radiation. The same forward bias voltage is effective to reverse bias the blocking junctions and constrain the pumping current to flow in a narrow stripe-like channel through the mesa.

In a preferred embodiment, step (3) results in the fabrication of a DH and is followed by forming a second pair of laterally spaced blocking p-n junctions separated by a window in substantial alignment with the mesa. Illustratively, the latter pair of junctions is fabricated by the steps of (4) epitaxially growing a third layer on the structure of opposite conductivity to the contiguous portion of the structure, (5) etching a stripe window in the third layer to expose a stripe of the underlying structure, and (6) depositing a metal contact on the bifurcated third layer and exposed stripe of the underlying structure. As with the first pair of laterally spaced junctions, the second pair is also reverse biased when the light emitting p-n junction is forward biased. This configuration further constrains current to flow in a narrow stripe-like channel between the stripe window and the stripe mesa, and has resulted in the lowest thresholds for our DH-LCC lasers.

In another aspect, our invention is an LCC stripe geometry junction laser comprising a substrate of one conductivity type and having a stripe mesa on a major surface thereof, a first pair of layers of the opposite conductivity type formed on the major surface on both sides of the mesa and contiguous with the side walls thereof, and a laser structure formed on the first layers and the mesa so that the interface between the first layers and the structure forms a first pair of laterally spaced blocking p-n junctions separated by the mesa. The laser structure has an active region and a light-emitting p-n junction therein, which when forward biased and pumped with current above threshold, causes the active region to emit laser radiation. The same forward bias is effective to reverse bias the blocking junctions so that the pumping current is constrained to flow through the mesa and hence through the active region in a narrow stripe-like channel.

In a preferred embodiment of our LCC laser, the laser structure is a DH and a second pair of laterally spaced blocking p-n junctions is formed on a free major surface thereof so that a window between the second pair is substantially aligned with the mesa. Forward bias of the light-emitting p-n junction also reverse biases the second pair and further constrains pumping current to flow in a narrow stripe-like channel between the window and the mesa.

BRIEF DESCRIPTION OF THE DRAWING

Our invention, together with its various features and advantages, can be readily understood from the following more detailed description taken in conjunction with the accompanying drawing in which the sole FIGURE is an end view of an LCC laser in accordance with an illustrative embodiment of our invention.

DETAILED DESCRIPTION

Structure

With reference now to the figure, there is shown an end view of a stripe geometry LCC junction laser which, in order to facilitate the description, has not been drawn to scale. The laser comprises a monocrystalline semiconductor body or substrate 10 of one conductivity type and a stripe mesa 10.1 formed on a major surface of substrate 10. Mesa 10.1 extends longitudinally along the length of the device from one laser mirror to the other (e.g., cleaved facets parallel to the plane of the paper). Laterally spaced epitaxial layers 12.1 and 12.2 of the opposite conductivity type are grown on the major surface on opposite sides of mesa 10.1 and in contact with the side walls thereof. A laser structure 15, including an active region 16.1 which emits stimulated radiation when forward biased, is epitaxially grown on layers 12.1 and 12.2 as well as the top of mesa 10.1 so that a first pair of laterally spaced blocking p-n junctions 13.1 and 13.2 is formed at the interface with layers 12.1 and 12.2. To achieve this end the first layer of structure 15 must be of same conductivity type as substrate 10 and of the opposite conductivity type as layers 12.1 and 12.2. The LCC is preferably completed by forming on the topmost major surface of structure 15 a second pair of laterally spaced blocking p-n junctions 21.1 and 21.2 which are separated by a window or opening 22.1 in substantial alignment with mesa 10.1. An electrode 26 is formed on the bottom of substrate 10, and another electrode 24 is formed on the top of structure 15 so that only electrode portion 24.1 in window 22.1 is in contact with structure 15.

In operation, active region 16.1 (which includes a p-n junction) is forward biased and pumping current is applied thereto by means of a voltage source 28 (e.g., a battery) connected between electrodes 24 and 26. Under these conditions, both pairs of blocking junctions marked -x-x-x- are reverse biased which constrains the pumping current 19 to flow in a narrow stripe-like channel (e.g., about 10 $\mu$m wide) between electrode portion 24.1 through mesa 10.1 to substrate electrode 26. The current flow channel thus defines the zone 16.1 of layer 16 which is actually active in the sense that stimulated emission emanates therefrom. For CW operation at room temperature the laser is typically mounted on a suitable heat sink (not shown) by means well known in the art and the active layer 16 is less than about 1 $\mu$m thick (for Group III(a)-V(a) materials).

Preferably the laser structure 15 is a double heterostructure (DH) which includes first and second opposite conductivity type, wide bandgap, cladding layers 14 and 18 separated from one another by a narrower bandgap active layer 16 which may be compensated, n-type, p-type or both n- and p-type (e.g., where layer 16 is itself composed of contiguous n- and p-layers as in commonly known PpnN or Ppn N DH lasers). The layers themselves are typically binary, ternary or quaternary compounds of Group III(a)-V(a) materials chosen so that the cladding layers can be lattice matched to the active layer. For example, layers 14, 16 and 18 typically comprise $Al_xGa_{1-x}As$, $Al_yGa_{1-y}As$ and $Al_zGa_{1-z}As$, respectively, with $Y < x, z$; $0 < x,z$; $0 \leq y \lesssim 0.4$ (the direct-indirect cross-over) for operation in the wavelength range of about 0.8–0.9 $\mu$m. Illustratively, $x = z = 0.24$ and $y = 0.08$. $Al_yGa_{1-y}As_{1-q}P_q$ with small amounts of P ($q \lesssim 0.03$) operates in the same range. At longer wavelengths of about 1.0–1.3 $\mu$m GaAsSb can be used as the active layer with AlGaAsSb cladding layers, or InGaAsP can be used as the active layer with InP cladding layers.

Fabrication

The following describes process steps which we employed in the fabrication of a GaAs-AlGaAs stripe geometry DH-LCC of the type discussed above.

A 100 $\mu$m thick (100) GaAs n-type wafer (i.e., substrate 10) doped with Si to $10^{18}$ cm$^{-3}$ was obtained from commercial sources and was masked with AZ1350 photoresist (not shown). A parallel array of narrow stripe masked areas about 5–25 $\mu$m wide on 380 $\mu$m centers was formed on the wafer using conventional photolithography procedures. The exposed portions of the wafer were etched with $H_2SO_4:H_2O_2(30\%):H_2O = 1:8:10$ at 24° C. and then the photoresist was stripped off. This procedure formed a parallel array of stripe mesas (e.g., one is shown as 10.1) which were about 5 $\mu$m high, 5–25 $\mu$m wide and oriented along the [$\overline{1}10$] direction.

The layers 12.1-12.2, the laser structure 15 and layer 22 were then grown in a single LPE cycle using standard ramp cooling techniques and a conventional boatslider apparatus. For simplicity, growth of a single device will be described. In particular, the following epitaxial layers were grown on substrate 10 in the order recited: p-$Al_{0.22}Ga_{0.78}As$ layers 12.1-12.2, n-$Al_{0.45}Ga_{0.55}As$ cladding layer 14, p-GaAs active layer 16, p-

Al$_{0.45}$Ga$_{0.55}$As cladding layer 18, p-GaAs stop-etch and contacting layer 20 and n-Al$_{0.45}$Ga$_{0.55}$As layer 22.

More specifically, p-Al$_{0.22}$Ga$_{0.78}$As layers 12.1-12.2 were doped with Ge to about $10^{17}$cm$^{-3}$. The thickness of these layers tended to be maximum adjacent the mesa side walls and to decrease gradually away from the mesas. After dicing into individual lasers as shown in the figure, the minimum thickness was measured to be about 1.3 μm. Several factors are important. First, the minimum thickness and the carrier concentration (doping) of these layers should be mutually adapted so that under normal operating conditions (e.g., 10 V from source 28) the space charge region associated with reverse biased junctions 13.1-13.2 does not sweep into the substrate and cause breakdown. Second, the maximum thickness should be not much greater than the mesa height so that separate layers 12.1-12.2 do not join during growth and become one. Third, the growth of separate layers 12.1-12.2 is made possible because nucleation is inhibited on the top surface of mesa 10.1. Fourth, although layers 12.1-12.2 could be p-GaAs, the presence of Al in these layers reduces the solubility of As in the Ga-As-Al growth solution, which advantageously inhibits melt back of the substrate and thereby preserves the integrity of mesa 10.1.

The n-Al$_{0.45}$Ga$_{0.55}$As cladding layer 14 was doped with Sn to about $2\times10^{17}$cm$^{-3}$ and was approximately 2.3 μm thick. The p-GaAs active layer 16 was doped with Ge to about $1.5\times10^{17}$cm$^{-3}$ and was approximately 0.2 μm thick. The p-Al$_{0.45}$Ga$_{0.55}$As cladding layer 18 was doped with Ge to about $10^{17}$cm$^{-3}$ and was approximately 0.9 μm thick. Layers 14, 16 and 18 formed a double heterostructure.

Stop-etch and contacting p-GaAs layer 20 was doped with Ge to about $10^{18}$cm$^{-3}$ and was approximately 0.5 μm thick, and n-Al$_{0.45}$Ga$_{0.55}$As layer 22 was doped with Sn to about $10^{17}$cm$^{-3}$ and was approximately 2.3 μm thick.

Following the completion of LPE growth, we anodically grew a native oxide masking layer (not shown) on n-Al$_{0.45}$Ga$_{0.55}$As layer 22. Using the same photolithography mask as employed to form mesas 10.1, we formed 10-30 μm wide windows in the mask in substantial alignment with the first set of windows used to form the mesas. The exposed portions of n-layer 22 were then subjected to an iodine etchant (e.g. 113 gm KI, 65 gm I$_2$, 100 cc H$_2$O) which is selective in the sense that it etches AlGaAs but not GaAs to any appreciable extent. Consequently, etching of n-Al$_{0.45}$Ga$_{0.55}$As in the windows (e.g., 22.1) continues until the underlying portion of stop-etch p-GaAs layer 20 is exposed. Then etching essentially stops in the vertical direction. Use of this type of a stop-etch procedure is preferred because etching automatically continues until n-layer 22 is completely etched through, thereby bifurcating n-layer 22 and the p-n junction at the interface between layers 20 and 22 into a pair of spaced blocking junctions 21.1 and 21.2 separated by opening or window 22.1.

As with p-AlGaAs layers 12.1-12.2, the thickness and doping of n-AlGaAs layer 22 are mutually adapted to prevent breakdown under normal operating conditions of the laser.

Conventional electrodes were then metallized: for example, a Cr-Au electrode was deposited on n-layer 22 and the portion of p-GaAs layer 20 exposed by window 22.1 (metallization on GaAs is easier than on AlGaAs, hence the use of the terminology "contacting" layer 20); and an In-Au electrode was deposited on the bottom major surface of substrate 10. Finally, individual lasers, formed by the usual cleaving procedures, were mounted on suitable copper heat sinks.

Experimental Results

DH-LCC lasers with strip widths $\lesssim$14 μm operated in the lowest order mode for pumping currents up to about twice threshold, at which an optical output power of 16 mW per mirror face was measured. In these lasers, the half-power width of the lowest order mode increased symmetrically as the injection current was increased above threshold. For lasers with stripe widths $\lesssim$20 μm, clearly resolved higher order transverse modes in the junction plane were readily excited, sometimes, even for currents near threshold.

Of all the lasers tested, excellent linearity in the optical output power versus injection current characteristics was obtained for all stripe widths between about 10 and 30 μm, measured to an output power of 16 mW per mirror face with the exception of one laser with a stripe width of ~18 μm, which developed a gentle "kink" at ~3 mW. Below 3 mW, it was observed that this diode lased in a filament that was very much narrower than the stripe width, rather than exhibiting the usual mode pattern observed in other diodes with similar stripe widths.

Lasers with three rectangular stripe sizes were fabricated: (1) 32 μm $\times$240 μm, (2) 20 μm $\times$200 μm, and (3) 12 μm $\times$265 μm. In (1) and (2), even though successive higher order transverse modes in the junction plane were excited as injection current was increased, the light output versus current characteristic remained linear. Room temperature pulsed and CW threshold currents were as low as 45 mA and 65 mA, respectively, for a stripe area ~14 μm $\times$150 μm. For diodes with 20 μm $\times$200 μm and 30 μm $\times$250 μm stripes, typical threshold currents (pulsed) were 70 mA and 90 mA, respectively.

We also studied the dependence of the room temperature pulsed threshold current density as a function of the top stripe width (window 22.1). The threshold density was close to that obtained with other stripe geometry lasers. In order to compare these results with strip geometry lasers where current spreading is significant, lasers with composition identical to our DH-LCC lasers were grown with the exception that the lower pair of blocking junctions 13.1-13.2 was omitted. For these single current confinement (SCC) lasers, room temperature pulsed thresholds as low as 75 mA (11 μm $\times$190 μm) were obtained. The room temperature pulsed threshold current density as a function of the top channel width for the SCC lasers was also measured. In general, our lasers had threshold current densities reduced by ~30% as compared to the SCC lasers, emphasizing that current spreading had been reduced.

In addition, we investigated the effects of misaligning mesa 10.1 and window 22.1. We found that aligned and misaligned (by ~10 μm) lasers with the same stripe width had approximately the same current density thresholds. Though both possessed clean optical mode patterns, they had quite different optical intensity distributions in the junction plane at the output mirror. In the aligned lasers both the current flow and the optical mode intensity were centered in the middle of the stripe-like channel between window 22.1 and mesa 10.1. In the misaligned lasers current flowed through window 22.1 and then toward one side of the channel. This pattern of current flow was reflected in a lateral shift of the lasing mode toward that side.

It is to be understood that the above-described arrangements are merely illustrative of the many possible specific embodiments which can be devised to represent application of the principles of our invention. Numerous and varied other arrangements can be devised in accordance with these principles by those skilled in the art without departing from the spirit and scope of the invention. In particular, while mesa 10.1 is shown to have a trapezoidal shape, other shapes such as inverted trapezoidal are also suitable and can be fabricated by the use of well known combinations of crystal orientation and preferential etchants. In addition, while certain conductivity types are shown in the figure and described in the section headed "Fabrication", it will be apparent that the conductivity types of all layers can be reversed. Moreover, although our experiments involved stripe widths of 10–30 μm, narrower widths as small as 1μm could also be used. Finally, although the foregoing LCC structures have been described in terms of junction lasers, it is apparent that the principles of our invention can be applied to LEDs of either the edge-emitting type (i.e., those which emit radiation parallel to the junction plane as does a laser) or of the perpendicular emitting type (e.g., a Burrus diode which emits normal to the junction plane).

What is claimed is:

1. A method of fabricating a stripe geometry junction laser comprising the steps of:
   (a) forming a mesa on a major surface of a monocrystalline semiconductor body of one conductivity type,
   (b) growing simultaneously a pair of laterally spaced epitaxial layers of the opposite conductivity type on said major surface and contiguous with the side walls of said mesa by means of a liquid phase epitaxial process in which growth nucleation on the top of said mesa is inhibited, and
   (c) growing a laser structure on said spaced layers and the top of said mesa so that a first pair of laterally spaced blocking p-n junctions separated by said mesa are formed at the interface with said pair of layers.

2. The method of claim 1 wherein in step (b) the composition of the solution used to grow said pair of layers is adapted to inhibit melt-back of said mesa.

3. The method of claim 1 wherein in step (b) said pair of layers is grown with a thickness and carrier concentration which are mutually adapted to prevent breakdown of said first pair of blocking junctions under normal operating conditions of said laser.

4. The method of claim 1 further including the step of (d) forming a second pair of laterally spaced p-n junctions on said structure so that said second pair are separated by a stripe window in substantial alignment with said mesa.

5. The method of claim 4 wherein step (d) includes the steps of:
   (d1) growing a first epitaxial layer of said opposite conductivity type on a free major surface of said structure, said layer being substantially resistant to a subsequent selective etching step,
   (d2) growing a second epitaxial layer of said one conductivity type on said first layer so as to form a blocking p-n junction at the interface therebetween,
   (d3) forming an etch resistant mask on said second layer,
   (d4) opening a stripe window in said mask in substantial alignment with said mesa, and
   (d5) subjecting said second layer to a selective etchant which, in the area of said window, etches an opening through said second layer and essentially stops etching at said interface, thereby bifurcating said second layer and bifurcating said junction of step (d2) into a second pair of laterally spaced blocking p-n junctions separated by said opening.

6. The method claim 5 wherein in step (d2) said second layer is grown to a thickness and carrier concentration which are mutually adapted to prevent breakdown of said second pair of blocking junctions under normal operating conditions of said laser.

7. The method of claim 6 including the steps of (e) forming an electrode on a free major surface of said body and (f) forming an electrode on the bifurcated portions of said second layer of step (d2) and on the portion of said first layer exposed in said opening by step (d5).

8. A method of fabricating a stripe geometry junction laser comprising the steps of:
   (a) forming a stripe mesa on a major surface of (100) n-type GaAs substrate,
   (b) growing simultaneously a pair of laterally spaced p-AlGaAs layers on said major surface and contiguous with the side walls of said mesa by means of a liquid phase epitaxy process in which growth nucleation on the top of said mesa is inhibited,
   (c) epitaxially growing an n-Al$_x$Ga$_{1-x}$As first cladding layer on said spaced layers and the top of said mesa so that a first pair of blocking p-n junctions separated by said mesa are formed at the interface with said pair of layers,
   (d) epitaxially growing an Al$_y$Ga$_{1-y}$As active layer on said first cladding layer,
   (e) epitaxially growing a p-Al$_z$Ga$_{1-z}$As second cladding layer on said active layer so that $0 < x,z$; $y < x,z$; $0 \leq y \lesssim 0.4$ and steps (c), (d) and (e) form a double heterostructure laser configuration,
   (f) epitaxially growing a p-GaAs stop-etch and contacting layer on said second cladding layer,
   (g) epitaxially growing an n-AlGaAs layer on said p-GaAs layer so as to form a blocking p-n junction at the interface therebetween,
   (h) forming on said n-AlGaAs layer of step (g) an oxide layer which is resistant to a subsequent etching step,
   (i) opening a stripe window in said oxide layer in substantial alignment with said mesa,
   (j) subjecting said n-AlGaAs layer of step (g) to a selective etchant which attacks said layer in said window but not said mask, and which forms a stripe opening in said n-AlGaAs layer but stops etching at said interface with said p-GaAs layer, thereby bifurcating said n-AlGaAs layer and bifurcating said junction of step (g) into a second pair of laterally spaced blocking p-n junctions separated by said opening,
   (k) removing the remaining portions of said oxide layer,
   (l) forming an electrode on a free major surface of said substrate, and
   (m) forming an electrode on said bifurcated n-AlGaAs layer and the portion of said p-GaAs layer exposed by said opening.

9. The method of claim 8 wherein in step (a) said mesa is formed by depositing a stripe mask on said substrate over the area where said mesa is to be formed and subjecting the unmasked areas of said substrate to a solution of $H_2SO_4$, $H_2O_2$ and $H_2O$, in step (h) said oxide layer is formed by anodically growing a native oxide layer on said n-AlGaAs layer, and in step (j) said etchant comprises a solution of KI, $I_2$ and $H_2O$.

* * * * *